US012577655B2

(12) United States Patent
Gelatos et al.

(10) Patent No.: US 12,577,655 B2
(45) Date of Patent: Mar. 17, 2026

(54) METHODS FOR SELECTIVE MOLYBDENUM DEPOSITION

(71) Applicant: Applied Materials, Inc., Santa Clara, CA (US)

(72) Inventors: Avgerinos V. Gelatos, Scotts Valley, CA (US); Thomas Empante, Santa Clara, CA (US); Yang Hu, Sunnyvale, CA (US)

(73) Assignee: Applied Materials Inc., Santa Clara, CA (US)

( * ) Notice: Subject to any disclaimer, the term of this patent is extended or adjusted under 35 U.S.C. 154(b) by 358 days.

(21) Appl. No.: 18/231,526

(22) Filed: Aug. 8, 2023

(65) Prior Publication Data

US 2024/0052480 A1     Feb. 15, 2024

Related U.S. Application Data

(60) Provisional application No. 63/398,196, filed on Aug. 15, 2022.

(51) Int. Cl.
*C23C 16/04*      (2006.01)
*C23C 16/14*      (2006.01)
*H01L 21/285*     (2006.01)

(52) U.S. Cl.
CPC .............. *C23C 16/04* (2013.01); *C23C 16/14* (2013.01); *H01L 21/28568* (2013.01)

(58) Field of Classification Search
CPC .......................... H01L 21/28562; C23C 16/04
See application file for complete search history.

(56) References Cited

U.S. PATENT DOCUMENTS

| | | | |
|---|---|---|---|
| 5,198,689 A | * | 3/1993 | Fujioka ................ H10D 10/021 |
| | | | 257/199 |
| 8,961,814 B2 | | 2/2015 | Van Duren et al. |
| 9,583,389 B2 | | 2/2017 | Romero et al. |
| 9,780,182 B2 | | 10/2017 | Peri et al. |
| 10,283,513 B1 | | 5/2019 | Zhou et al. |
| 10,797,681 B1 | | 10/2020 | Hurwitz et al. |
| 10,978,418 B2 | | 4/2021 | Mahler et al. |
| 11,230,764 B2 | | 1/2022 | Lehn et al. |
| 2012/0225553 A1 | | 9/2012 | Lazovsky et al. |
| 2018/0053660 A1 | * | 2/2018 | Jandl ..................... C23C 16/045 |
| 2020/0343134 A1 | | 10/2020 | Kovalgin et al. |
| 2021/0098258 A1 | | 4/2021 | Degai et al. |
| 2021/0301391 A1 | | 9/2021 | Givens et al. |
| 2021/0317570 A1 | | 10/2021 | Yoon et al. |
| 2022/0238323 A1 | | 7/2022 | Clark |
| 2024/0047269 A1 | * | 2/2024 | Na ..................... H01L 21/76843 |

OTHER PUBLICATIONS

International Search Report for PCT/US2023/030197, dated Nov. 30, 2023.

* cited by examiner

*Primary Examiner* — Erik Kielin
(74) *Attorney, Agent, or Firm* — Moser Taboada

(57) ABSTRACT

Methods and apparatus for selectively depositing a molybdenum layer on a substrate which includes contacting a substrate surface initially comprising a first portion comprising amorphous silicon, and a second portion comprising silicon and germanium with a molybdenum precursor to selectively form a molybdenum layer on the second portion of the substrate surface.

20 Claims, 4 Drawing Sheets

Figure 1:
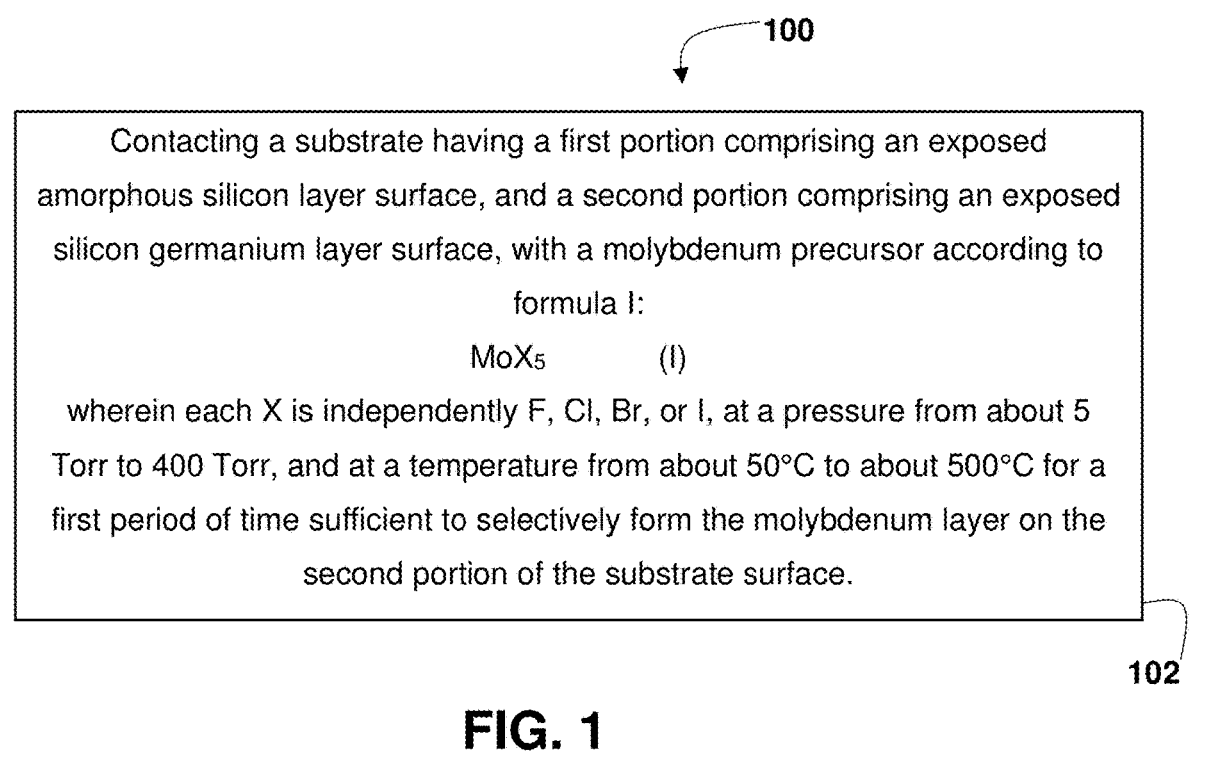

100

Contacting a substrate having a first portion comprising an exposed amorphous silicon layer surface, and a second portion comprising an exposed silicon germanium layer surface, with a molybdenum precursor according to formula I:

MoX₅        (I)

wherein each X is independently F, Cl, Br, or I, at a pressure from about 5 Torr to 400 Torr, and at a temperature from about 50°C to about 500°C for a first period of time sufficient to selectively form the molybdenum layer on the second portion of the substrate surface.

METHODS FOR SELECTIVE MOLYBDENUM DEPOSITION

CROSS-REFERENCE TO RELATED APPLICATIONS

This application claims benefit of U.S. provisional patent application Ser. No. 63/398,196, filed Aug. 15, 2022, which is herein incorporated by reference in its entirety.

FIELD

Embodiments of the present disclosure generally relate to selective deposition of a metal layers on a substrate.

BACKGROUND

In the fabrication of microelectronic devices, titanium silicide (TiSi) is used when forming both n-type metal oxide semiconductor (NMOS) and p-type metal oxide semiconductor (PMOS) structures on the same substrate. However, the inventors have noticed that, with the downward scaling of transistors, a comparatively large Schottky barrier height of TiSi-PMOS structures results in undesirably high contact resistance.

Accordingly, the inventors have provided improved methods and structures for processing a substrate which can address these and other issues.

SUMMARY

In embodiments, a method of selectively depositing a molybdenum layer on a substrate having a first portion comprising an exposed silicon layer surface, and a second portion comprising an exposed silicon germanium layer surface, comprises contacting the substrate with a molybdenum precursor according to formula I:

$$MoX_5 \qquad (I)$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface.

In embodiments, a method of processing a substrate comprises a deposition cycle comprising contacting a substrate surface initially comprising a first portion consisting essentially of silicon, and a second portion comprising silicon and germanium with a molybdenum precursor comprising molybdenum pentachloride dispersed in molecular hydrogen, at a pressure from about 5 Torr to 400 Torr, and at a temperature from about 50° C. to about 500° C. for a first period of time from about 0.1 seconds to about 10 seconds to form a molybdenum layer on the substrate surface; wherein the molybdenum layer is selectively deposited on the second portion of the substrate surface at a ratio of greater than or equal to about 10:1 relative to the first portion of the substrate surface; and followed by contacting the substrate surface with molecular hydrogen and not with the molybdenum precursor for a second period of time, wherein the deposition cycle is repeated for a number of times sufficient to form a final molybdenum layer on the second portion of the substrate having a thickness from about 2 nanometer to about 50 nanometers.

In embodiments, a non-transitory, computer readable medium having instructions stored thereon that, when executed, cause a method for to be performed, the method comprising selectively depositing a molybdenum layer on a substrate having an exposed silicon layer and an exposed silicon germanium layer, selectively depositing a molybdenum layer on a substrate having a first portion comprising an exposed silicon layer surface, and a second portion comprising an exposed silicon germanium layer surface, comprises contacting the substrate with a molybdenum precursor according to formula I:

$$MoX_5 \qquad (I)$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 1 is a flow chart of a method 100, according to an embodiment of the present disclosure.

Figure 2:
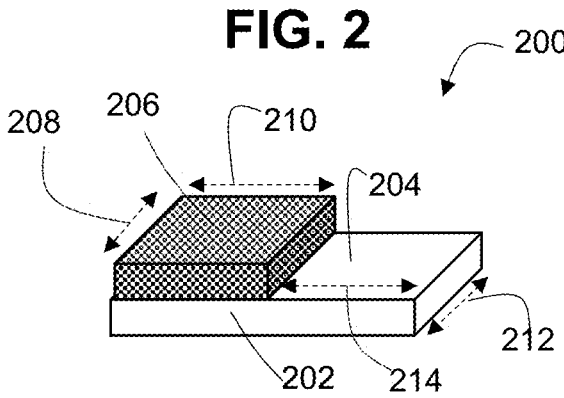
FIG. 2 is a block diagram showing a substrate with a first portion and a second portion according to an embodiment of this disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of methods of selectively depositing a molybdenum layer on a substrate having a first portion comprising an exposed silicon layer surface, and a second portion comprising an exposed silicon germanium layer surface, comprises contacting the substrate with a molybdenum precursor according to formula I:

$$MoX_5 \qquad (I)$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface. In embodiments, the selective deposition of the molybdenum on the second portion of the substrate surface is 100:1 relative to the first portion of the substrate surface.

In embodiments the molybdenum precursor comprises molybdenum pentachloride. In embodiments, the molybdenum precursor is molybdenum pentachloride.

In embodiments, the surface of the second portion of the substrate consists essentially of a silicon-germanium alloy. In embodiments, the substrate surface is contacted with the molybdenum precursor at a pressure from about 5 Torr to 350 Torr. In embodiments, the substrate surface is contacted with the molybdenum precursor at a temperature from about 300° C. to about 350° C. In embodiments, the first period of time is greater than or equal to about 0.1 seconds and less than or equal to about 10 seconds. In embodiments, the substrate surface is contacted with the molybdenum precursor dispersed in molecular hydrogen. In embodiments a volume-to-volume ratio of the molybdenum precursor to the molecular hydrogen is from about 1:500 to about 1:5000 molybdenum precursor to molecular hydrogen.

In embodiments, the method further comprises a deposition cycle comprising the contacting of the substrate surface with the molybdenum precursor for the first period of time, followed by contacting the substrate surface with molecular hydrogen and not with the molybdenum precursor for a second period of time, wherein the deposition cycle is repeated for a number times sufficient to form a final molybdenum layer on the second portion of the substrate having a thickness from about 2 nanometer to about 50 nanometers. In embodiments the second period of time is from about 0.1 seconds to about 30 seconds. In embodiments the method further comprises contacting the substrate surface with the molecular hydrogen throughout the deposition cycle. In embodiments the method further comprises annealing the substrate after the final molybdenum layer has been formed. In embodiments the method further comprises a precleaning the substrate surface prior to the contacting of the substrate surface with the molybdenum precursor. In embodiments, the method further comprises selectively depositing a titanium layer onto the first portion of the substrate surface relative to the second portion of the substrate surface. In embodiments, essentially no titanium is deposited on the molybdenum layer deposited on the second portion of the substrate surface.

In embodiments, a method of processing a substrate, comprises a deposition cycle comprising contacting a substrate surface initially comprising a first portion consisting essentially of silicon, and a second portion comprising silicon and germanium with a molybdenum precursor comprising molybdenum pentachloride dispersed in molecular hydrogen, at a pressure from about 5 Torr to 400 Torr, and at a temperature from about 50° C. to about 500° C. for a first period of time from about 0.1 seconds to about 10 seconds to form a molybdenum layer on the substrate surface; wherein the molybdenum layer is selectively deposited on the second portion of the substrate surface at a ratio of greater than or equal to about 10:1 relative to the first portion of the substrate surface; and followed by contacting the substrate surface with molecular hydrogen and not with the molybdenum precursor for a second period of time, wherein the deposition cycle is repeated for a number of times sufficient to form a final molybdenum layer on the second portion of the substrate having a thickness from about 2 nanometer to about 50 nanometers.

In embodiments, the method further comprises selectively depositing a titanium layer onto the first portion of the substrate surface at a ratio of greater than or equal to about 2:1 relative to the second portion of the substrate surface via chemical vapor deposition.

In embodiments, a non-transitory, computer readable medium having instructions stored thereon that, when executed, cause a method for to be performed, the method comprises selectively depositing a molybdenum layer on a substrate having a first portion comprising an exposed silicon layer surface, and a second portion comprising an exposed silicon germanium layer surface, the method comprising contacting the substrate with a molybdenum precursor according to formula I:

$$MoX_5 \qquad \text{(I)}$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface.

FIG. 1 is a flow chart of a method 100 of selectively depositing a molybdenum layer on a substrate having an exposed silicon layer and an exposed silicon germanium layer according to an embodiment of the present disclosure. In embodiments, the method block of FIG. 1 may be performed by a device.

As shown in FIG. 1, method 100 includes contacting a substrate having a first portion comprising an exposed silicon layer surface, and a second portion comprising an exposed silicon germanium layer surface, with a molybdenum precursor according to formula I:

$$MoX_5 \qquad \text{(I)}$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface (block 102).

While FIG. 1 shows a single block, in embodiments, method 100 may include other blocks in addition to block 102 depicted in FIG. 1.

FIG. 2 is a block diagram showing the processing substrate 200 wherein the base substrate layer 202 has an exposed surface of first portion 204, having a total area initially present on the first portion 204 of the substrate surface, e.g., the length 214 of the first portion of the substrate surface multiplied by the width 212 of the first portion 204 of the substrate surface. The substrate also includes an exposed surface of a second portion 206 having a total area initially present on the second portion 206 of the substrate surface, e.g., the length 210 of the second portion 206 of the substrate surface multiplied by the width 208 of the second portion 206 of the substrate surface.

In embodiments, the surface of the first portion 204 comprises silicon. In embodiments, the surface of the first portion 204 consists essentially of silicon. In embodiments, the surface of the first portion 204 consists of silicon. In embodiments, the surface of the first portion 204 comprises silicon. In embodiments, the surface of the first portion 204 consists essentially of silicon. In embodiments, the surface of the first portion 204 consists of silicon. In embodiments, the surface of the second portion 206 of the substrate comprises germanium. In embodiments, the surface of the second portion 206 of the substrate consists essentially of a silicon-germanium alloy. In embodiments, the surface of the second portion 206 of the substrate consists of a silicon-germanium alloy. In embodiments, a substrate surface initially comprising a first portion 204 comprising amorphous silicon, and a second portion 206 comprising silicon and germanium.

Figure 3:
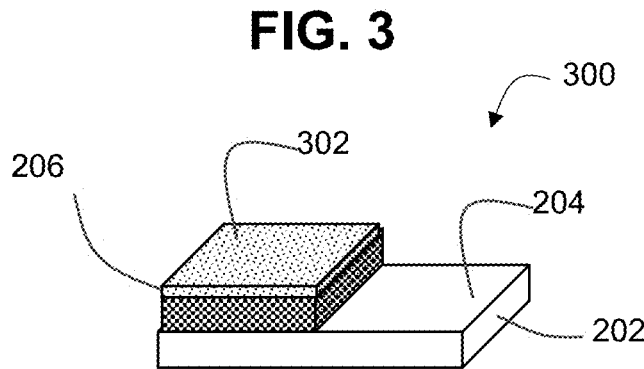
FIG. 3 is a block diagram showing the substrate of FIG. 2 with a layer selectively deposited on the second portion of the substrate according to an embodiment of this disclosure.

FIG. 3 is a block diagram showing a processed substrate 300 wherein the substrate of FIG. 2 has been processed to form the molybdenum layer 302 selectively deposited on the surface of the second portion 206 of the substrate according to an embodiment of this disclosure. In embodiments, the method of selectively depositing a molybdenum layer comprises contacting the substrate surface (i.e., the first portion 204 and the second portion 206 of the substrate surface) with a molybdenum precursor according to formula I:

$$MoX_5 \qquad (I)$$

wherein each X is independently F, Cl, Br, or I, at a pressure from about 5 Torr to 400 Torr, and at a temperature from about 50° C. to about 500° C. for a first period of time sufficient to form the molybdenum layer 302 on the surface of the second portion 206 of the substrate.

In embodiments, the molybdenum precursor comprises molybdenum pentachloride. In embodiments, the molybdenum precursor consists essentially of, or is molybdenum pentachloride.

In embodiments, the contacting of the substrate surface with a molybdenum precursor is conducted at a pressure of greater than or equal to about 5 Torr, or greater than or equal to about 10 Torr, or greater than or equal to about 20 Torr, or greater than or equal to about 25 Torr.

In embodiments, the contacting of the substrate surface with a molybdenum precursor is conducted at a pressure of less than or equal to about 400 Torr, or less than or equal to about 350 Torr, or less than or equal to about 300 Torr.

In embodiments, the contacting of the substrate surface with a molybdenum precursor is conducted at a pressure from about 5 Torr to 400 Torr.

In embodiments, the contacting of the substrate surface with a molybdenum precursor is conducted at a temperature of greater than or equal to about 50° C., or greater than or equal to about 100° C., or greater than or equal to about 200° C., or greater than or equal to about 250° C.

In embodiments, the contacting of the substrate surface with a molybdenum precursor is conducted at a temperature of less than or equal to about 500° C., or less than or equal to about 400° C., or less than or equal to about 300° C.

In embodiments, the contacting of the substrate surface with a molybdenum precursor is conducted at a temperature from about 50° C. to 500° C.

In embodiments, the contacting of the substrate surface with the molybdenum precursor is conducted in a cycle, wherein the substrate surface is contacted with the molybdenum precursor for a first period of time. In embodiments, the first period of time with which the substrate surface is contacted with the molybdenum precursor is greater than or equal to about 0.1 seconds, or greater than or equal to about 1 second, or greater than or equal to about 2 seconds per cycle.

In embodiments, the first period of time with which the substrate surface is contacted with the molybdenum precursor is less than or equal to about 10 seconds, or less than or equal to about 7 seconds, or less than or equal to about 5 seconds per cycle.

In embodiments, the first period of time with which the substrate surface is contacted with the molybdenum precursor is greater than or equal to about 0.1 seconds and less than or equal to about 10 seconds per cycle.

In embodiments, the substrate surface is contacted with the molybdenum precursor dispersed in a diluent comprising molecular hydrogen (H₂), or consisting essentially of molecular hydrogen (H₂). In embodiments, the substrate surface is contacted with the molybdenum precursor dispersed in molecular hydrogen (H₂).

In embodiments, a volume-to-volume ratio of the molybdenum precursor to the molecular hydrogen is less than or equal to about 1 part molybdenum precursor to 500 parts molecular hydrogen (1:500), or less than or equal to about 1:700, or less than or equal to about 1:1000, and greater than or equal to about 1:5000.

In embodiments, a volume-to-volume ratio of the molybdenum precursor to the molecular hydrogen is from about 1 part molybdenum precursor to 500 parts molecular hydrogen to 1 part molybdenum precursor to 5000 parts molecular hydrogen (1:500 to 1:5000). In embodiments, the contacting of the substrate surface with a molybdenum precursor is selective with respect to the surface of the second portion of the substrate. In other words, the amount of molybdenum deposited on the second portion of the substrate surface per unit area of the second portion of the substrate surface is greater than the amount of molybdenum deposited on the first portion of the substrate surface per unit area of the first portion of the substrate surface.

In embodiments, an amount of the molybdenum layer 302 formed on the second portion 206 of the substrate surface, divided by a total area of the second portion 206 of the substrate surface initially present on the substrate surface (e.g., the length 210 of the second portion 206 of the substrate surface multiplied by the width 208 of the second portion 206 of the substrate surface shown in FIG. 2), is greater than or equal to about 10 times, or greater than or equal to about 50 times, or greater than or equal to about 100 times, or greater than or equal to about 500 times an amount of the molybdenum layer 302 formed, if any, on the first portion 204 of the substrate surface, divided by a total area of the first portion 204 initially present on the substrate surface (e.g., the length 214 of the first portion 204 of the substrate surface multiplied by the width 212 of the first portion 204 of the substrate surface shown in FIG. 2).

Figure 4:
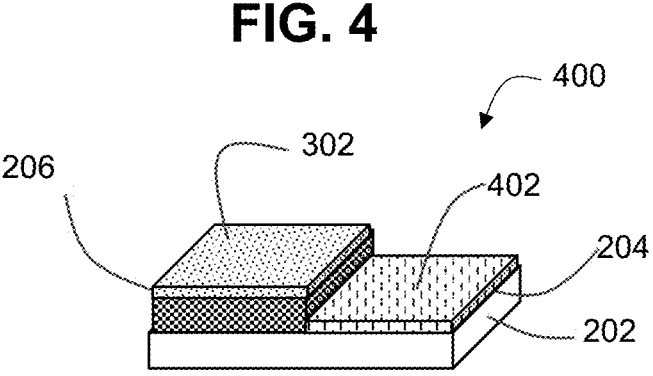
FIG. 4 is a block diagram showing the substrate of FIG. 3 with another layer selectively deposited on the first portion of the substrate according to an embodiment of this disclosure.

As depicted in FIG. 4, in embodiments, the method further comprises selectively depositing a titanium layer (402) onto the first portion (204) of the substrate surface. In embodiments, the method further comprises depositing a titanium layer (402) onto the substrate surface, wherein an amount of the titanium layer (402) formed on the first portion (204) of the substrate surface, divided by the total area of the first portion of the substrate surface initially present on the substrate surface (see FIG. 2), is greater than or equal to about 2 times, or greater than or equal to about 5 times, or greater than or equal to about 10 times an amount of the titanium layer formed, if any, on the molybdenum layer (302) deposited on the second portion (206) of the substrate surface, divided by the total area of the second portion initially present on the substrate surface (e.g., the length 214 of the first portion 204 of the substrate surface multiplied by the width 212 of the first portion 204 of the substrate surface shown in FIG. 2). In embodiments, essentially no titanium is deposited on the molybdenum layer (302) deposited on the second portion (306) of the substrate surface.

In embodiments, the method includes a deposition cycle wherein the selective depositing of the molybdenum layer is repeated as part of a cycle until a molybdenum layer of an intended thickness is formed. In embodiments, the deposition cycle comprises the contacting of the substrate surface with the molybdenum precursor for the first period of time, followed by contacting the substrate surface with molecular hydrogen and not with the molybdenum precursor fora second period of time, wherein the cycle is repeated for a number times sufficient to form a final molybdenum layer on the second portion of the substrate.

In embodiments, the final molybdenum layer on the second portion of the substrate has a thickness greater than or equal to about 2 nanometers, or greater than or equal to about 5 nanometers, or greater than or equal to about 10 nanometers.

In embodiments, the final molybdenum layer on the second portion of the substrate has a thickness of less than or equal to about 50 nanometers, or less than or equal to about 30 nanometers, or less than or equal to about 20 nanometers.

In embodiments, the final molybdenum layer on the second portion of the substrate has a thickness from about 2 nanometer to about 50 nanometers.

In embodiments, the second period of time with which the substrate surface is contacted with the molecular hydrogen gas is greater than or equal to about 0.1 seconds, or greater than or equal to about 1 second, or greater than or equal to about 5 seconds per cycle.

In embodiments, the second period of time with which the substrate surface is contacted with the molecular hydrogen gas is less than or equal to about 30 seconds, or less than or equal to about 20 seconds, or less than or equal to about 10 seconds per cycle.

In embodiments, the second period of time with which the substrate surface is contacted with the molecular hydrogen gas is from about 0.1 seconds to about 30 seconds.

In embodiments, the method further comprises contacting the substrate surface with the molecular hydrogen gas throughout the cycle.

Figure 5:
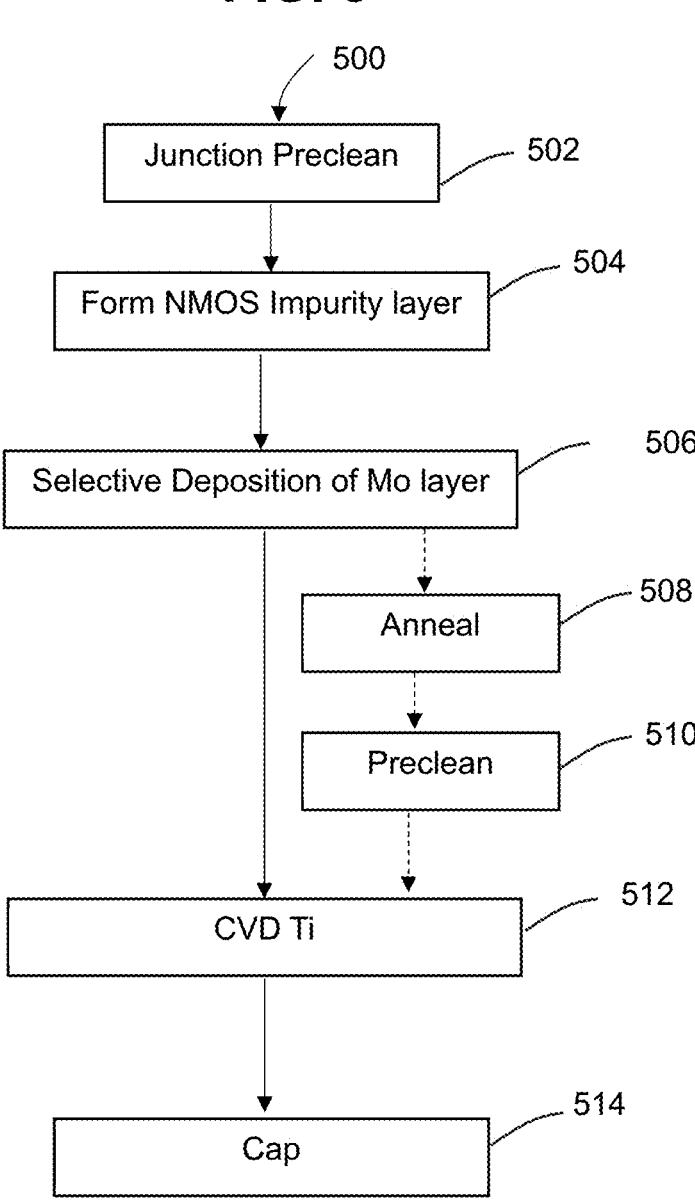
FIG. 5 is a block diagram showing a process of forming a PMOS and NMOS side of a substrate utilizing an embodiment of a method according to this disclosure.

As depicted in FIG. 5, in embodiments, the selective deposition of the molybdenum layer is part of a larger process. For example, in embodiments, the selective deposition of a molybdenum layer as described above can be a part of a process 500 of forming NMOS and PMOS structures on a substrate. In embodiments, the process 500 comprises a junction preclean (block 502), followed by forming an NMOS impurity layer (block 504), which is followed by the selective deposition of a Mo layer (block 506) according to embodiments disclosed herein. In embodiments, after the selective deposition of the Mo layer (block 506), an optional anneal (block 508) and/or a preclean (block 510) may occur. The selective deposition of the Mo layer (block 506) is then followed by deposition of a Ti layer (block 512), e.g., via CVD, followed by forming a cap (block 514).

In embodiments, the method further comprises annealing the substrate after the final molybdenum layer has been formed. In embodiments, the substrate is annealed at a temperature of greater than or equal to about 300° C., or greater than or equal to about 400° C., or greater than or equal to about 500° C., and less than or equal to about 1000° C., for a period of time of greater than or equal to about 10 seconds, or greater than or equal to about 30 seconds, or greater than or equal to about 60 seconds, or greater than or equal to about 30 minutes.

In embodiments, the method further comprises a pre-cleaning of the substrate surface prior to the contacting of the substrate surface with the molybdenum precursor. Suitable precleaning of the substrate may include dry etching and/or wet chemical cleaning of the substrate.

Figure 6:
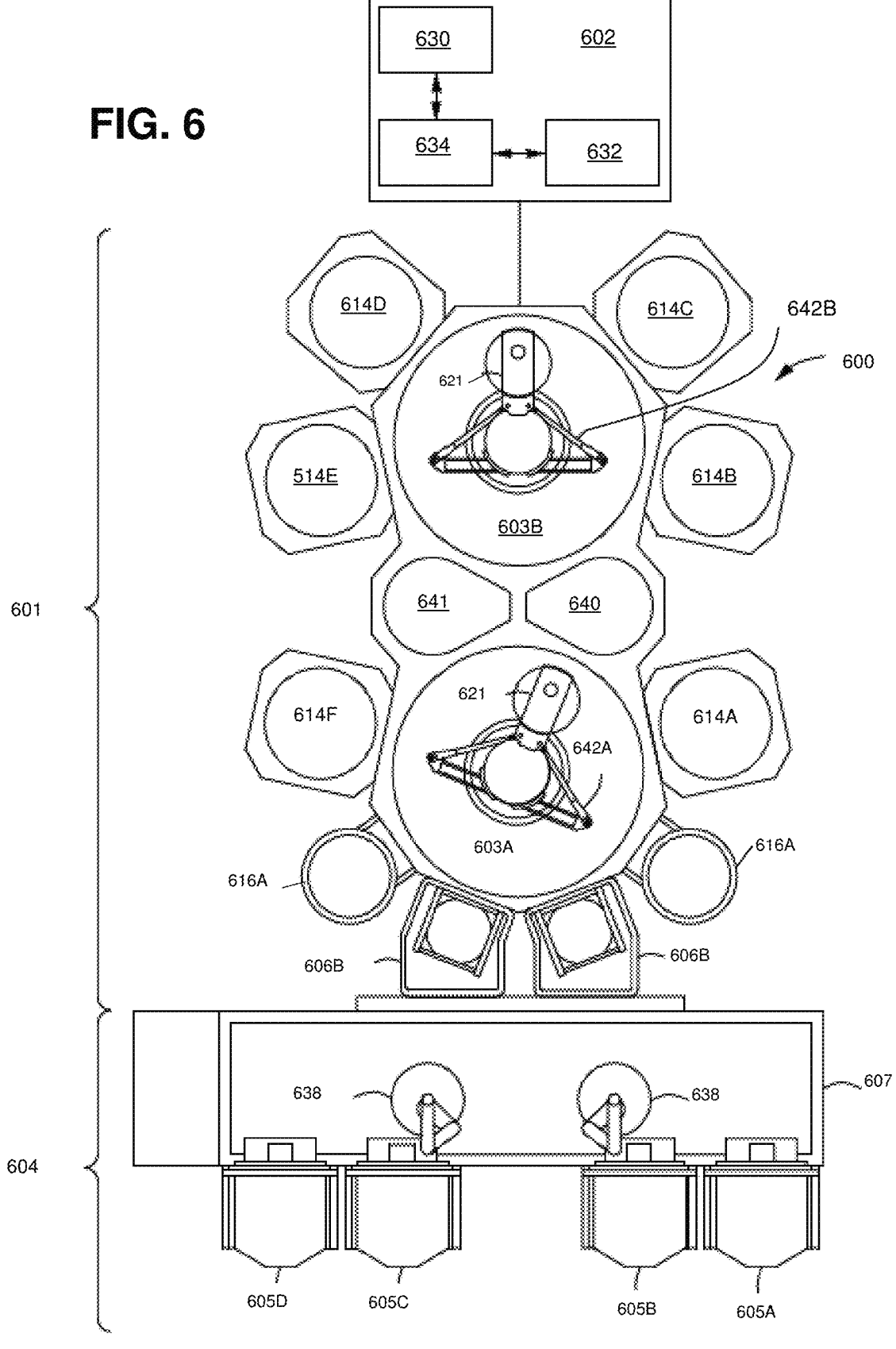
FIG. 6 depicts a cluster tool suitable to perform the method to produce a layered substrate according to embodiments disclosed herein.

The methods described herein may be performed in individual process chambers that may be provided in a standalone configuration or as part of one or more cluster tools, for example, an integrated tool 600 (i.e., cluster tool) described below with respect to FIG. 6. In some embodiments, the method described herein may be performed in individual process chambers provided as a standalone chamber or as part of a cluster tool. In embodiments, a cluster tool is configured for performing the methods for processing a substrate as described herein.

Examples of the integrated tool 600 include the CENTURA® and ENDURA® integrated tools, available from Applied Materials, Inc., of Santa Clara, Calif. However, the methods described herein may be practiced using other cluster tools having suitable process chambers coupled thereto, or in other suitable process chambers. For example, in some embodiments the inventive methods discussed above may advantageously be performed in an integrated tool such that there are limited or no vacuum breaks while processing.

The methods described herein may be performed in individual process chambers that may be provided in a standalone configuration or as part of a cluster tool, for example, the integrated tool 600 (i.e., cluster tool) described below with respect to FIG. 6. The advantage of using an integrated tool 600 is that there is no vacuum break between chambers and, therefore, no requirement to degas and pre-clean a substrate before treatment in a chamber. For example, in some embodiments the methods discussed above may advantageously be performed in an integrated tool such that there are limited or no vacuum breaks between processes, limiting or preventing contamination of the substrate such as oxidation and the like. The integrated tool 600 includes a vacuum-tight processing platform 601, a factory interface 604, and a system controller 602. The processing platform 601 comprises multiple processing chambers, such as 614A, 614B, 614C, 614D, 614E, and 614F operatively coupled to a vacuum substrate transfer chamber (transfer chambers 603A, 603B). The factory interface 604 is operatively coupled to the transfer chamber 603A by one or more load lock chambers (two load lock chambers, such as 606A and 606B shown in FIG. 6).

In some embodiments, the factory interface 604 comprises at least one docking station 607, and at least one factory interface robot 638 to facilitate the transfer of the semiconductor substrates. The docking station 607 is configured to accept one or more front opening unified pods (FOUP). Four FOUPS, such as 605A, 605B, 605C, and 605D are shown in the embodiment of FIG. 5. The factory interface robot 638 is configured to transfer the substrates from the factory interface 604 to the processing platform 601 through the load lock chambers, such as 606A and 606B. Each of the load lock chambers 606A and 606B have a first port coupled to the factory interface 604 and a second port coupled to the transfer chamber 603A. The load lock chamber 606A and 606B are coupled to a pressure control system (not shown) which pumps down and vents the load lock chambers 606A and 606B to facilitate passing the substrates between the vacuum environment of the transfer chamber 603A and the substantially ambient (e.g., atmospheric) environment of the factory interface 604. The transfer chambers 603A, 603B have vacuum robots 542A, 542B disposed in the respective transfer chambers 603A, 603B. The vacuum robot 542A is capable of transferring substrates 621 between the load lock chamber 606A, 606B, the processing chambers 614A and 614F and a cooldown station 540 or a pre-clean station 541. The vacuum robot 542B is capable of transferring substrates 621 between the cooldown station 540 or pre-clean station 541 and the processing chambers 614B, 614C, 614D, and 614E.

In some embodiments, the processing chambers 614A, 614B, 614C, 614D, 614E, and 614F are coupled to the transfer chambers 603A, 603B. The processing chambers 614A, 614B, 614C, 614D, 614E, and 614F may comprise, for example, atomic layer deposition process chambers, physical vapor deposition process chambers, chemical vapor deposition chambers, annealing chambers, or the like. The chambers may include any chambers suitable to perform all or portions of the methods described herein, as discussed above, in one or more ALD deposition chambers, non-conformal layer PVD deposition chambers, and CVD deposition chambers, and the like. In some embodiments, one or more optional service chambers (shown as 616A and 616B) may be coupled to the transfer chamber 603A. The service chambers 616A and 616B may be configured to perform other substrate processes, such as degassing, orientation, substrate metrology, cool down, and the like.

The system controller 602 controls the operation of the tool 600 using a direct control of the process chambers 614A, 614B, 614C, 614D, 614E, and 614F or alternatively, by controlling the computers (or controllers) associated with the process chambers 614A, 614B, 614C, 614D, 614E, and 614F and the tool 600. In operation, the system controller 602 enables data collection and feedback from the respective chambers and systems to optimize performance of the tool 600. The system controller 602 generally includes a central processing unit (CPU) 630, a memory 634, and a support circuit 632. The CPU 630 may be any form of a general-purpose computer processor that can be used in an industrial setting. The support circuit 632 is conventionally coupled to the CPU 630 and may comprise a cache, clock circuits, input/output subsystems, power supplies, and the like. Software routines, such as a method as described above may be stored in the memory 634 and, when executed by the CPU 630, transform the CPU 630 into a specific purpose computer (system controller) 602. The software routines may also be stored and/or executed by a second controller (not shown) that is located remotely from the tool 600.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

Embodiments according to the instant disclosure include:

E1. A method of selectively depositing a molybdenum layer on a substrate having a first portion comprising an exposed silicon layer surface, and a second portion comprising an exposed silicon germanium layer surface, comprising:

contacting the substrate with a molybdenum precursor according to formula I:

$$MoX_5 \tag{I}$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface.

E2. The method according to embodiment E1, wherein the selective deposition of the molybdenum on the second portion of the substrate surface is 100:1 relative to the first portion of the substrate surface.

E3. The method according to one or more of embodiments E1 through E2, wherein the molybdenum precursor comprises molybdenum pentachloride.

E4. The method according to one or more of embodiments E1 through E3, wherein the molybdenum precursor is molybdenum pentachloride.

E5. The method according to one or more of embodiments E1 through E4, wherein the surface of the second portion of the substrate consists essentially of a silicon-germanium alloy.

E6. The method according to one or more of embodiments E1 through E5, wherein the substrate surface is contacted with the molybdenum precursor at a pressure from about 5 Torr to 350 Torr.

E7. The method according to one or more of embodiments E1 through E6, wherein the substrate surface is contacted with the molybdenum precursor at a temperature from about 300° C. to about 350° C.

E8. The method according to one or more of embodiments E1 through E7, wherein the first period of time is greater than or equal to about 0.1 seconds and less than or equal to about 10 seconds.

E9. The method according to one or more of embodiments E1 through E8, wherein the substrate surface is contacted with the molybdenum precursor dispersed in molecular hydrogen.

E10. The method according to embodiment E9, wherein a volume-to-volume ratio of the molybdenum precursor to the molecular hydrogen is from about 1:500 to about 1:5000 molybdenum precursor to molecular hydrogen.

E11. The method according to one or more of embodiments E1 through E10, further comprising:

a deposition cycle comprising the contacting of the substrate surface with the molybdenum precursor for the first period of time, followed by contacting the substrate surface with molecular hydrogen and not with the molybdenum precursor for a second period of time, wherein the deposition cycle is repeated for a number times sufficient to form a final molybdenum layer on the second portion of the substrate having a thickness from about 2 nanometer to about 50 nanometers.

E12. The method according to one or more of embodiments E1 through E11, wherein the second period of time is from about 0.1 seconds to about 30 seconds.

E13. The method according to one or more of embodiments E1 through E12, further comprising contacting the substrate surface with the molecular hydrogen throughout the deposition cycle.

E14. The method according to one or more of embodiments E1 through E13, further comprising annealing the substrate after the final molybdenum layer has been formed.

E15. The method according to one or more of embodiments E1 through E14, further comprising a precleaning the substrate surface prior to the contacting of the substrate surface with the molybdenum precursor.

E16. The method according to one or more of embodiments E1 through E15, further comprising selectively depositing a titanium layer onto the first portion of the substrate surface relative to the second portion of the substrate surface.

E17. The method according to one or more of embodiments E1 through E16, wherein essentially no titanium is deposited on the molybdenum layer deposited on the second portion of the substrate surface.

E18. The method according to one or more of embodiments E1 through E17, comprising:

a deposition cycle comprising contacting a substrate surface initially comprising a first portion consisting essentially of silicon, and a second portion comprising silicon and germanium with a molybdenum precursor comprising molybdenum pentachloride dispersed in molecular hydrogen, at a pressure from about 5 Torr to 400 Torr, and at a temperature from about 50° C. to about 500° C. for a first period of time from about 0.1 seconds to about 10 seconds to form a molybdenum layer on the substrate surface;

wherein the molybdenum layer is selectively deposited on the second portion of the substrate surface at a ratio of greater than or equal to about 10:1 relative to the first portion of the substrate surface; and followed by contacting the substrate surface with molecular hydrogen and not with the molybdenum precursor for a second period of time, wherein the deposition cycle is repeated for a number of times sufficient to form a final molybdenum layer on the second portion of the substrate having a thickness from about 2 nanometer to about 50 nanometers.

E19. A method of processing a substrate, comprising:

a deposition cycle comprising contacting a substrate surface initially comprising a first portion consisting essentially of silicon, and a second portion comprising silicon and germanium with a molybdenum precursor comprising molybdenum pentachloride dispersed in molecular hydrogen, at a pressure from about 5 Torr to 400 Torr, and at a temperature from about 50° C. to about 500° C. for a first period of time from about 0.1 seconds to about 10 seconds to form a molybdenum layer on the substrate surface;

wherein the molybdenum layer is selectively deposited on the second portion of the substrate surface at a ratio of greater than or equal to about 10:1 relative to the first portion of the substrate surface; and followed by contacting the substrate surface with molecular hydrogen and not with the molybdenum precursor for a second period of time, wherein the deposition cycle is repeated for a number of times sufficient to form a final molybdenum layer on the second portion of the substrate having a thickness from about 2 nanometer to about 50 nanometers.

E20. The method according to one or more of embodiments E18 through E19, further comprising selectively depositing a titanium layer onto the first portion of the substrate surface at a ratio of greater than or equal to about 2:1 relative to the second portion of the substrate surface via chemical vapor deposition.

E21. A non-transitory, computer readable medium having instructions stored thereon that, when executed, cause a method according to one or more of embodiments E1 through E20 to be performed.

E22. A non-transitory, computer readable medium having instructions stored thereon that, when executed, cause a method for to be performed, the method comprising:

selectively depositing a molybdenum layer on a substrate having a first portion comprising an exposed amorphous silicon layer surface, and a second portion comprising an exposed silicon germanium layer surface, comprising:

contacting the substrate with a molybdenum precursor according to formula I:

$$MoX_5 \qquad\qquad (I)$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface.

While the foregoing is directed to embodiments of the present disclosure, other and further embodiments of the disclosure may be devised without departing from the basic scope thereof.

The invention claimed is:

1. A method of selectively depositing a molybdenum layer on a substrate surface having a first portion comprising an exposed silicon layer surface, and a second portion comprising an exposed silicon germanium layer surface, comprising:

contacting the substrate surface with a molybdenum precursor according to formula I:

$$MoX_5 \qquad\qquad (I)$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface relative to the silicon layer surface of the first portion.

2. The method of claim 1 wherein the selective deposition of the molybdenum layer on the second portion of the substrate surface is 100:1 relative to the first portion of the substrate surface.

3. The method of claim 1, wherein the molybdenum precursor comprises molybdenum pentachloride.

4. The method of claim 1, wherein the molybdenum precursor is molybdenum pentachloride.

5. The method of claim 1, wherein the second portion of the substrate surface consists essentially of a silicon-germanium alloy.

6. The method of claim 1, wherein the substrate surface is contacted with the molybdenum precursor at a pressure from about 5 Torr to 350 Torr.

7. The method of claim 1, wherein the substrate surface is contacted with the molybdenum precursor at a temperature from about 300° C. to about 350° C.

8. The method of claim 1, wherein the first period of time is greater than or equal to about 0.1 seconds and less than or equal to about 10 seconds.

9. The method of claim 1, wherein the substrate surface is contacted with the molybdenum precursor dispersed in molecular hydrogen.

10. The method of claim 9, wherein a volume-to-volume ratio of the molybdenum precursor to the molecular hydrogen is from about 1:500 to about 1:5000 the molybdenum precursor to the molecular hydrogen.

11. The method of claim 1, further comprising:

a deposition cycle comprising the contacting of the substrate surface with the molybdenum precursor for the first period of time, followed by contacting the substrate surface with molecular hydrogen and not with the molybdenum precursor for a second period of time, wherein the deposition cycle is repeated for a number times sufficient to form a final molybdenum layer on the second portion of the substrate surface having a thickness from about 2 nanometer to about 50 nanometers.

12. The method of claim 11, wherein the second period of time is from about 0.1 seconds to about 30 seconds.

13. The method of claim 11, further comprising contacting the substrate surface with the molecular hydrogen throughout the deposition cycle.

14. The method of claim 11, further comprising annealing the substrate surface after the final molybdenum layer has been formed.

15. The method of claim 1, further comprising a precleaning the substrate surface prior to the contacting of the substrate surface with the molybdenum precursor.

16. The method of claim 1, further comprising selectively depositing a titanium layer onto the first portion of the substrate surface relative to the second portion of the substrate surface.

17. The method of claim 16, wherein essentially no titanium is deposited on the molybdenum layer deposited on the second portion of the substrate surface.

18. A method of processing a substrate, comprising:

a deposition cycle comprising contacting a substrate surface initially comprising a first portion consisting essentially of silicon, and a second portion comprising silicon and germanium with a molybdenum precursor comprising molybdenum pentachloride dispersed in molecular hydrogen, at a pressure from about 5 Torr to 400 Torr, and at a temperature from about 50° C. to about 500° C. for a first period of time from about 0.1 seconds to about 10 seconds to form a molybdenum layer on the substrate surface;

wherein the molybdenum layer is selectively deposited on the second portion of the substrate surface at a ratio of greater than or equal to about 10:1 relative to the first portion of the substrate surface; and followed by contacting the substrate surface with the molecular hydrogen and not with the molybdenum precursor for a second period of time, wherein the deposition cycle is repeated for a number of times sufficient to form a final molybdenum layer on the second portion of the substrate surface having a thickness from about 2 nanometer to about 50 nanometers.

19. The method of claim 18, further comprising selectively depositing a titanium layer onto the first portion of the substrate surface at a ratio of greater than or equal to about 2:1 relative to the second portion of the substrate surface via chemical vapor deposition.

20. A non-transitory, computer readable medium having instructions stored thereon that, when executed, cause a method for to be performed, the method comprising:

selectively depositing a molybdenum layer on a substrate surface having a first portion comprising an exposed amorphous silicon layer surface, and a second portion comprising an exposed silicon germanium layer surface, comprising:

contacting the substrate surface with a molybdenum precursor according to formula I:

$$MoX_5 \tag{I}$$

wherein each X is independently F, Cl, Br, or I, at a pressure from about 5 Torr to 400 Torr, and at a temperature from about 50° C. to about 500° C. for a first period of time sufficient to selectively form the molybdenum layer on the second portion of the substrate surface relative to the silicon layer surface of the first portion.

* * * * *